United States Patent
Itakura

(10) Patent No.: US 6,986,093 B2
(45) Date of Patent: Jan. 10, 2006

(54) APPARATUS FOR REPRODUCING DATA AND APPARATUS FOR RECORDING/REPRODUCING DATA

(75) Inventor: Akihiro Itakura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 563 days.

(21) Appl. No.: 10/060,789

(22) Filed: Jan. 30, 2002

(65) Prior Publication Data

US 2003/0005384 A1    Jan. 2, 2003

(30) Foreign Application Priority Data

Jun. 25, 2001   (JP)   ............... 2001-191676

(51) Int. Cl.
*H03M 13/00*   (2006.01)
(52) U.S. Cl. .................... 714/755; 714/786
(58) Field of Classification Search ........... 714/795, 714/792, 755, 752, 786; 375/341, 263; 360/32, 360/53; 386/124, 45

See application file for complete search history.

(56) References Cited

U.S. PATENT DOCUMENTS

| | | | | |
|---|---|---|---|---|
| 5,689,532 A | * | 11/1997 | Fitzpatrick | 375/341 |
| 6,516,136 B1 | * | 2/2003 | Lee | 386/124 |
| 6,798,593 B2 | * | 9/2004 | Hattori et al. | 360/53 |

FOREIGN PATENT DOCUMENTS

JP    2000-183758    6/2000

OTHER PUBLICATIONS

Ryan, "Performance of High Rate Turbo Codes on a PR-4-Equalized Magnetic Recording Channel", Proc., IEEE Int. Conference on Communications, Atlanta, Georgia, pp. 947-951, Jun. 1998.

* cited by examiner

*Primary Examiner*—Shelly Chase
(74) *Attorney, Agent, or Firm*—Greer, Burns & Crain, Ltd.

(57) ABSTRACT

An apparatus for reproducing data has decoded data generated based on a reproduction signal from a recording medium in accordance with an iterative decoding process corresponding to a turbo coding method. The apparatus also has a value of a channel value constant, which is used in an iterative decoding process, controlled when the decoded data is generated in accordance with the iterative decoding process.

11 Claims, 13 Drawing Sheets

APPARATUS FOR REPRODUCING DATA AND APPARATUS FOR RECORDING/REPRODUCING DATA

BACKGROUND OF THE INVENTION

1. Field of the Invention

The present invention generally relates to an apparatus for reproducing data and an apparatus for recording/reproducing data such as a magnetic disk apparatus, an optical disk apparatus, or a like, and more particularly to the apparatus for recording/reproducing data, which writes or reads data to or from a recording medium by using a turbo coding approach and an iterative decoding approach, and a device for reproducing data, which reads data from the recording medium by using the iterative decoding approach.

2. Description of the Related Art

A turbo coding approach is a coding technology having a greater coding gain and has been a subject of attention in the communication field. In general, a turbo coding device encodes a data bit sequence u by using two recursive convolutional encoders. For example, the turbo coding device can be configured as shown in FIG. 1 and FIG. 2.

In FIG. 1, a turbo coding device 10 includes a first encoder 11, an interleaver ($\pi$1) 12, a second encoder 13, and a multiplexer (MUX/Puncture) 14.

The first encoder 11 and the second encoder 13 are recursive convolutional encoders. The first encoder 11 generates a parity bit sequence p1 with respect to the data sequence u input to the turbo coding device 10. The interleaver ($\pi$1) 12 outputs a signal sequence in which a bit arrangement order of the data bit sequence u is changed. The second encoder 13 generates a parity bit sequence p2 with respect to a signal sequence from the interleaver ($\pi$1) 12.

The MUX/Puncture 14 generates an encoded data bit sequence yk by multiplexing the data bit sequence u with the parity bit sequence p1 output from the first encoder 11 and the parity bit sequence p2 output from the second encoder 13 in accordance with a predetermined rule. When multiplexing the data bit sequence u with the parity bit sequence p1 and the parity bit sequence p2, the MUX/Puncture 14 thins off (punctures) bits in accordance with a predetermined rule (a puncture function) so as to improve a coding rate. The encoded data bit sequence yk generated as described above is output from the turbo coding device 10. In a communication system, the encoded data bit sequence yk is modulated in accordance with a predetermined rule and is output from a transmitting device.

Alternatively, in the turbo coding device 10 configured as shown in FIG. 2 as a turbo coding device 11, two recursive convolutional encoders (the first encoder 11 and the second encoder 13) are connected in series. In this example, the data bit sequence u is encoded by the first encoder 11 and the bit arrangement order of a signal sequence obtained by encoding the data bit sequence u is changed by the interleaver ($\pi$1) 12. A signal sequence output from the interleaver ($\pi$1) 12 is encoded by the second encoder 13. Then, a signal sequence obtained by the second encoder 13 is output as the encoded data bit sequence yk.

When a signal transmitted from the transmitting device as described above is received as a receive signal by a receiving device, the receive signal is demodulated in the receiving device. Then, signal value sequences U, Y1, and Y2 are obtained with respect to a data bit sequence u and parity bit sequences p1 and p2 included in the encoded data bit sequence yk. The signal value sequences U, Y1, and Y2 are input to a decoding device corresponding to the turbo coding device 11.

In the decoding device, a soft output decode is conducted by two decoders corresponding to the two of the first encoder 11 and the second encoder 13. Soft output information (likelihood information) regarding each information bit obtained from one decoder is provided to another decoder as anterior information. And such an operation is repeatedly conducted. For example, such the decoding device is configured as shown in FIG. 3 so as to process the signal value sequences U as demodulated signal sequences corresponding the data bit sequence u and the parity bit sequences p1 and p2, respectively, included in the coded data bit sequence yk output from the turbo coding device 10 shown in FIG. 1.

In FIG. 3, a decoding device 20 includes a first SISO (Soft In Soft Out) decoder 21, interleavers ($\pi$1) 22 and 23, a deinterleaver ($\pi 1^{-1}$) 25, a second SISO decoder 24, and a hard decision decoder 26. The first SISO decoder 21 corresponds to the first encoder 11 and the second SISO decoder 24 corresponds to the second encoder 13.

When the first SISO decoder 21 receives signal value sequences U and Y1, the first SISO decoder 21 inputs the signal value sequences U and Y1 and also inputs anterior information L(u). Then, the first SISO decoder 21 conducts a MAP (Maximum a Posterior Probability) decoding. A posterior probability is a probability whether or not a bit uk is "0" or "1" in a condition in that a signal value sequence Y (y0, y1, ..., yk, ..., yn) is detected. In the MAP decoding, an LLR (Log-Likelihood Ratio) L(u*), which is a logarithm ratio of a posterior probability P (uk|Y), is calculated as follows:

$$L(u^*)=L(uk|Y)=ln\{P(uk=1|Y)/P(uk=0|Y)\} \quad (1).$$

In the above calculation in accordance with an equation (1), the signal value sequence Y is the signal value sequences U and Y1.

A probability P(uk=1|Y) where the bit uk is "1" and a probability P(uk=0|Y) where the bit uk is "0" are calculated based on a trellis diagram showing a state transition obtained from the signal value sequences U and Y1.

On the other hand, the LLR L(u*) is calculated in accordance with the following equation (2):

$$L(u^*)=Lc^*yk+L(uk)+Le(uk) \quad (2).$$

Lc*yk: channel value
(Lc: a constant (channel value constant) determined by S/N (Signal to Noise ratio), which is the ratio between the magnitude of a signal (meaningful information) and the magnitude of background noise,
yk: received signal series y0, y1, ..., yn)
L(uk): anterior information as a known appearance probability related to uk=1, uk=0)
Le(uk): external likelihood information obtained by associating with uk from a constraint of a code.

Based on the above equation (2), the first SISO decoder 21 calculates the external likelihood information Le(uk) in accordance with a following equation:

$$Le(uk)=L(u^*)-Lc^*yk-L(uk) \quad (3).$$

The LLR L(u*) calculated as described in the above equation (3) is substituted (refer to the equation (1)) so as to obtain the external likelihood information Le(uk). A sequence of the external likelihood information Le(uk) sequentially obtained is supplied to the second SISO decoder 24 as a sequence of the anterior information L(uk)

via the interleaver (π1) 23. In addition to the sequence of the anterior information L(uk), the signal value sequence U is input to the decoding device 20 is supplied to the second SISO decoder 24 through the interleaver (π1) 22, and a signal value sequence Y2 is input directly to the SISO decoder 24.

The second SISO decoder 24 calculates a new LLR L(u*) by considering the anterior information L(uk) input thereto according to the equation (1). And, the second SISO decoder 24 calculates the external likelihood information Le(uk) in accordance with the above equation (3) by using the LLR L(u*) and the anterior information L(uk) supplied from the first SISO decoder 21.

The external likelihood information Le(uk) obtained by the second SISO decoder 24 is supplied to the first SISO decoder 21 as the anterior information L(uk) via the deinterleaver (π1$^{-1}$) 25. And, the first SISO decoder 21 calculates the LLR L(u*) and the external likelihood information Le(uk) in accordance with a procedure described above by considering the anterior information L(uk). Then, the external likelihood L(uk) from the first SISO decoder 21 is supplied to the second SISO decoder 24 as the anterior information L(uk).

As described above, the first SISO decoder 21 and the second SISO decoder 24 use the external likelihood Le(uk) calculated on another decoder as the anterior information L(uk) so as to repeatedly calculate the LLR L(u*) (iterative decoding). It should be noted that the anterior information L(uk) is "0" (L(uk)=0) at a first calculation of the first SISO decoder 21.

The hard decision decoder 26 decides whether or not the bit uk is "0" or "1", based on the LLR L(u*) obtained by the second SISO decoder 24 when a decoding process described above is repeated a predetermined number of times. For example, the hard decision decoder 26 decides that the bit uk is "1" (uk=1) when the LLR L(u*) is positive (L(u*)>0). On the other hand, the hard decision decoder 26 decides that the bit uk is "0" (uk=0) when the LLR L(u*) is positive (L(u*)=0). A decision result of the hard decision decoder 26 is output as a decoding result uk.

While the decoding process is repeated (iterative decoding), a probability of a value ("0" or "1") to be originally obtained is becoming higher and a probability of an opposite value is becoming lower (a difference between a probability of the bit uk to be "0" and a probability of the bit uk to be "1"). Accordingly, reliability of a decision by the hard decision decoder 26 is increased.

A turbo coding/decoding approach as described above has been applied to a data recording/reproducing apparatus such as a magnetic disk apparatus, an optical disk apparatus, or the like. For example, an example applying the turbo coding/decoding approach to the magnetic disk apparatus is proposed in "Performance of High Rate Turbo Codes on a PR4-Equalized Magnetic Recording Channel", Proc. IEEE mt. Conf. on Communications, pp 947–951, 1998, edited by W. E. Ryan.

In the data recording/reproducing apparatus, the turbo coding approach is used for a recording system (write system) for writing data on a recording medium and the iterative decoding approach as described above is used for a reproducing system (read system) for reproducing data from the recording medium. By applying approaches such as these, it is possible to reproduce data recorded on the recording medium (the magnetic disk, the optical disk (including magneto-optical disk), or the like) at a high density with few data errors.

In the data recording/reproducing apparatus such as the magnetic disk apparatus, the optical disk apparatus, or the like, a commutative recording medium is used. Thus, a data decoding condition (a channel value constant Lc, a repetitive number, or a like) to which the data recording/reproducing apparatus applies for one recording medium is not always an optimum data decoding condition in another data recording/reproducing apparatus which reproduces data from the same recording medium. Also, the data decoding condition suitably applied to one recording medium is not always the optimum data decoding condition for another recording medium.

Moreover, when a different recording method is applied to a different region of one recording medium to record data (when a different detecting method detects data in the different region), the optimum data decoding condition is not always the same data decoding condition for data recorded on each region.

Furthermore, in a case in which data is written in a data decoding condition for writing data to a regular recording medium, to a recording medium whose characteristics are deteriorated, it is impossible to precisely reproduce data even if the iterative decoding is conducted based on a reproduction signal from the recording medium.

SUMMARY OF THE INVENTION

It is a general object of the present invention to provide a data reproducing apparatus and a data recording/reproducing apparatus in which the above-mentioned problems are eliminated.

A more specific object of the present invention is to provide the data reproducing apparatus and the data recording/reproducing apparatus that can reproduce data with few errors for any recording medium.

The above object of the present invention is achieved by an apparatus for reproducing data, including: a decoded data generating part generating decoded data based on a reproduction signal from a recording medium in accordance with an iterative decoding method corresponding to a turbo coding method, and a constant value controlling part controlling a value of a channel value constant used in an iterative decoding process when said decoded data is generated in accordance with the iterative decoding method.

Accordingly, in the apparatus, it is possible to control the channel value constant used during the iterative decoding process.

BRIEF DESCRIPTION OF THE DRAWINGS

Other objects, features, and advantages of the present invention will become more apparent from the following detailed description when read in conjunction with the accompanying drawings, in which.

DESCRIPTION OF THE PREFERRED EMBODIMENTS

An embodiment according to the present invention will now be described with reference to the figures.

Figure 4:
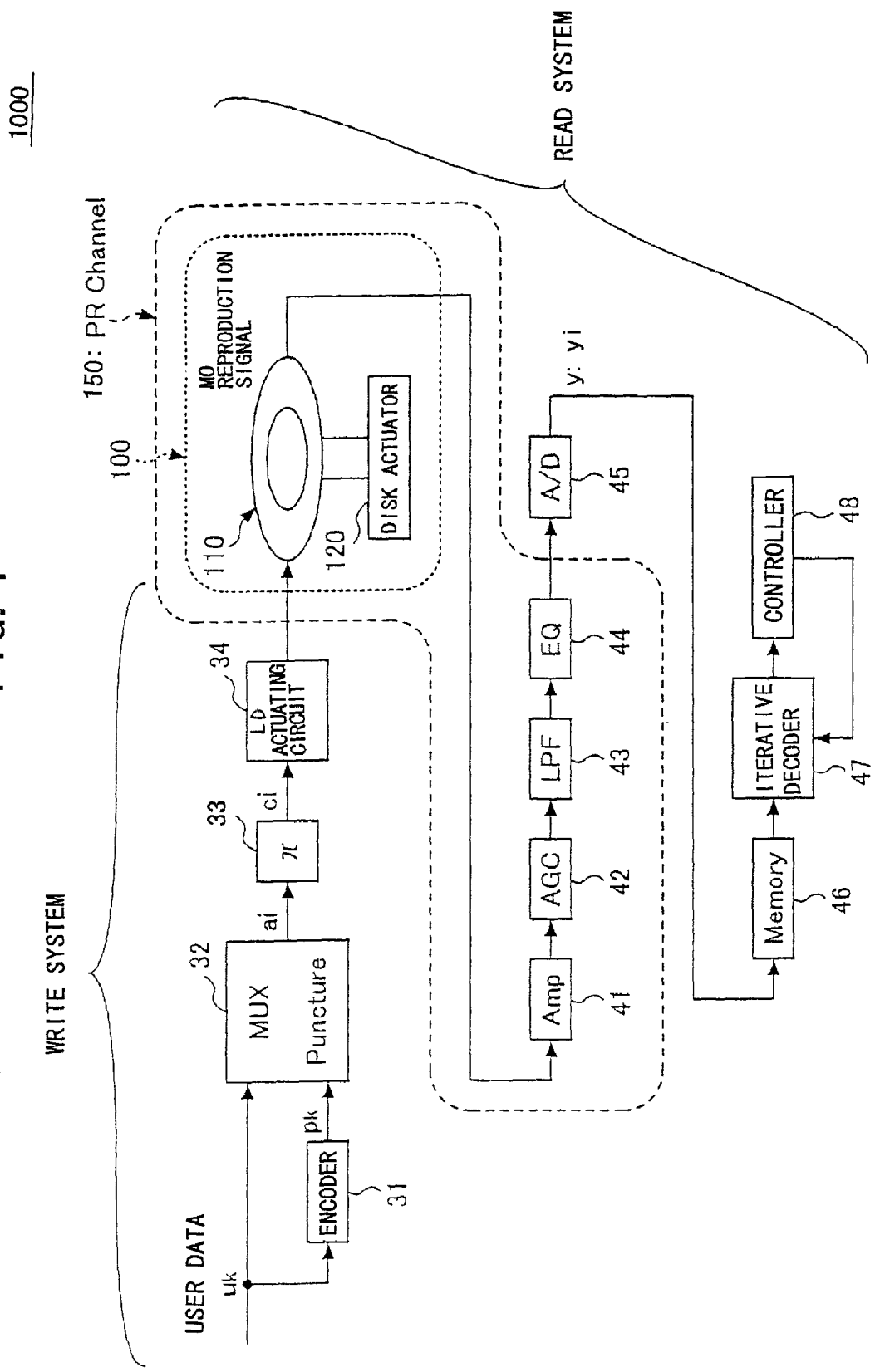
FIG. 4 is a block diagram showing a data recording/reproducing apparatus according to an embodiment of the present invention.

A data recording/reproducing apparatus can be configured as shown in FIG. 4. This data recording/reproducing apparatus in FIG. 4 is an optical disk apparatus using a magneto-optical disk (MO) as a recording medium.

In FIG. 4, a write system of a data recording/reproducing apparatus 1000 includes an encoder 31, an MUX (multiplexer) puncture 32, an interleaver ($\pi$) 33, and an LD (Laser Diode) actuating circuit 34. Also, the data recording/reproducing apparatus 1000 includes a recording/reproducing mechanism 100. The recording/reproducing mechanism 100 includes an optical head (not shown) having an optical beam output unit (for example, a laser diode (LD)), an optical detector (for example, a photo diode), a magneto-optical disk 110, and a disk actuator 120 rotating the magneto-optical disk 110 at a predetermined speed.

The encoder 31 generates a parity bit sequence pk corresponding to user data uk to be recorded. The MUX puncture 32 multiplexes the user data uk with a parity bit sequence pk generated by the encoder 31 in accordance with a predetermined rule. And the MUX puncture 32 punctures a bit in accordance with a predetermined rule (puncture function for dropping a bit to encode), from a bit sequence obtained by multiplexing the user data uk with a parity bit sequence pk, so that encoded data bit sequence ai is generated. The interleaver ($\pi$) 33 generates an encoded data bit sequence ci by changing an arrangement of the encoded data bit sequence ai encoded by the MUX puncture 32.

The LD actuating circuit 34 controls an optical beam output unit (not shown) of the recording/reproducing mechanism 100 based on the encoded data bit sequence ci. A signal is written on a magneto-optical disk 110 by an optical beam from optical beam output unit based on the encoded data bit sequence ci.

The signal is written to the magneto-optical disk 110 at a high density so as to provide a partial response waveform as a reproduction signal.

Figure 2:
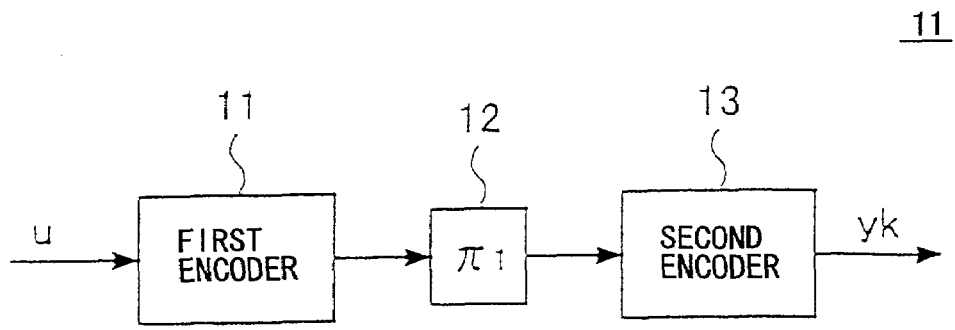
FIG. 2 is a block diagram showing another configuration example of the turbo coding device.

On the other hand, a read system of the data recording/reproducing apparatus 1000 includes an Amp (amplifier) 41, an AGC (Auto gain controller) 42, a LPF (Low Path Filter) 43, an equalizer (EQ) 44, and an A/D Analog to Digital) converter 45. A waveform of a reproduction signal MO, which is output from the optical detector (not shown) of the recording/reproducing mechanism 100, is adjusted by the Amp 41, the AGC 42, the LPF 43, and the equalizer 44. The waveform is regarded as a PR waveform (a partial response waveform). That is, the reproduction signal from the magneto-optical disk 110 is in a state in which a PR channel 150 substantially encodes the signal written to the optional disk 110. Accordingly, it is possible to realize a configuration of the turbo coding device 11 as shown in FIG.2, by the write system (the encoder 31 ) and a substantial encoding function in the PR channel 150.

Also, the read system includes a memory unit 46, an iterative decoder 47, and a controller 48. A signal, whose waveform is equalized as described above, is converted into a digital value at a predetermined period by the A/D converter 45. A sampling value yi is consecutively output from the A/D converter 45 and then is stored in the memory unit 46. Then, the sampling value yi stored in the memory unit 46 is decoded by the iterative decoder 47 (turbo decoding). The controller 48 controls a decoding condition of the iterative decoder 47 and also obtains decoded data output from the iterative decoder 47, as reproduction data.

As described above, the iterative decoder 47 includes the encoder 31 in the read system and a decoder corresponding to the encoding function in the PR channel 150. For example, the iterative decoder 47 is configured as shown in FIG. 5.

Figure 5:
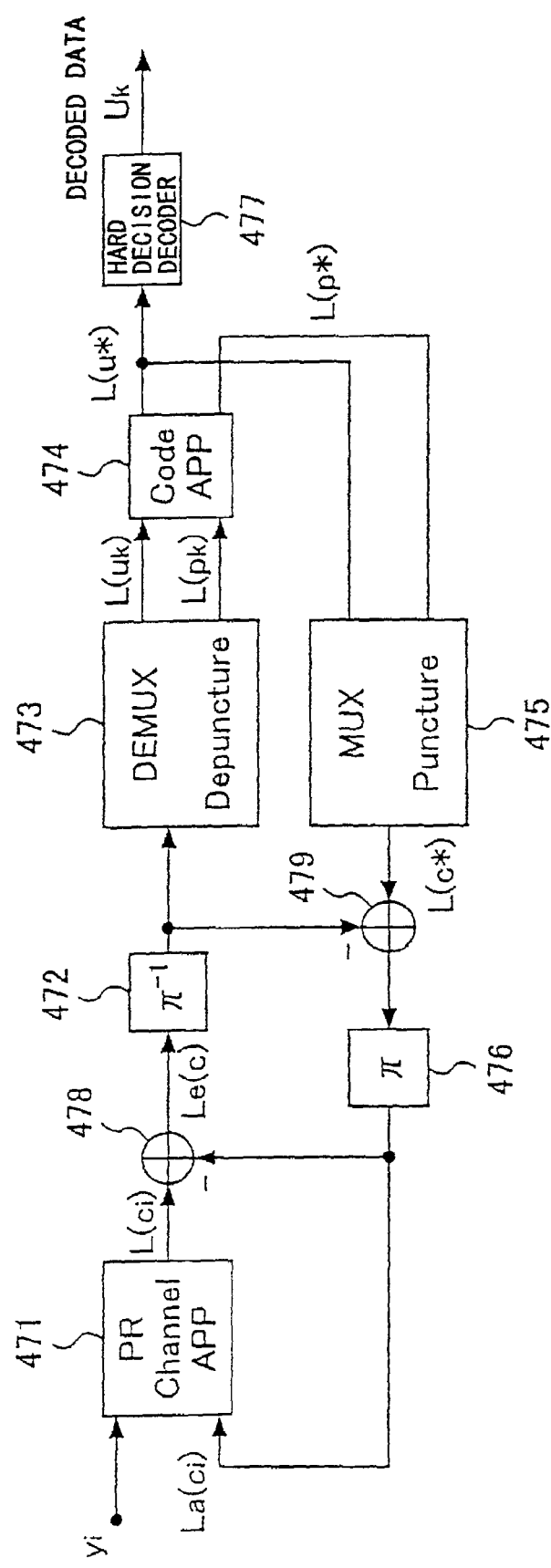
FIG. 5 is a block diagram showing a configuration example of the iterative decoder in the data recording/reproducing apparatus shown in FIG. 4.

In FIG. 5, the iterative decoder 47 includes a PR channel APP (a posterior probability decoding) 471, a deinterleaver ($\pi^{-1}$) 472, a DEMUX (demultiplexer) depuncture 473, a code APP 474, a MUX (multiplexer) puncture 475, an interleaver ($\pi$) 476, a hard decision decoder 477, a subtractor 478, and a subtractor 479.

Figure 3:
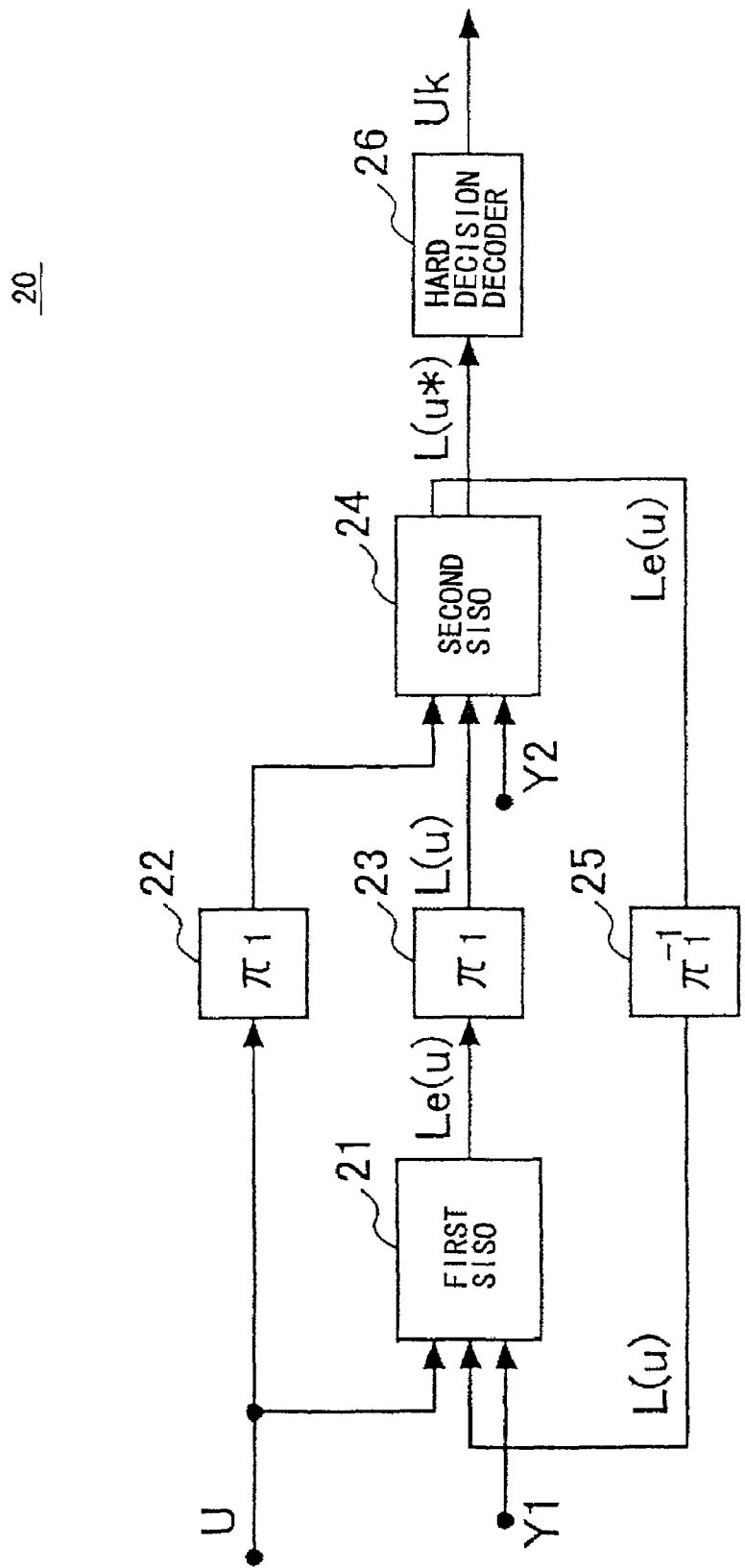
FIG. 3 is a block diagram showing a configuration example of a decoding device corresponding to the turbo coding device shown in FIG. 1.

The PR channel APP 471 corresponds to the encoding function in the PR channel 150 and conducts a posterior probability decoding (APP) (refer to the decoding device 20 in FIG. 3). In detail, under a condition in which a sampling value Y (y1, y2, . . . , yn) is detected, a LLR (Log-Likelihood Ratio) L(ci*), which is a ratio of a probability P(ci=1|Y) where the encoded data bit sequence ci is "1" to a probability P(ci=0|Y) where the encoded data bit sequence ci is "0", is calculated in accordance with the following expression (4).

$$L(ci^*)=ln\{P(uk=1|Y)/P(uk=0|Y)\} \qquad (4)$$

Each of probabilities P(ci=1|Y) and P(ci=0|Y) is calculated based on the trellis diagram showing a state transition of a sampling value yi. For this calculation, the channel value constant Lc is used.

The subtractor 478 subtracts anterior information La(ci) based on an output from the code APP 474 (described later)

from likelihood information L(ci*) output from the PR channel APP 471 and obtains external likelihood information Le(c).

The deinterleaver ($\pi^{-1}$) 472 changes an arrangement order of a sequence of the external likelihood information Le(c) consecutively obtained as described above and supplies to the DEMUX depuncture 473. The DEMUX depuncture 473 demultiplexes a sequence of the likelihood information into a sequence of the likelihood information L(uk) corresponding to a data bit uk and a sequence of likelihood information L(pk) corresponding to a parity bit pk. In addition, information is additionally provided (depuncture function) in accordance with a rule corresponding to the predetermined rule (the puncture function of the MUX puncture 32) for puncturing a bit in the encoding process.

The code APP 474 is a decoder corresponding to the encoder 31 in the write system described above, and conducts the posterior probability decoding (APP). In detail, the code APP 474 calculates a Log-Likelihood Ratio L(u*) shown by a posterior probability (a probability where uk=1 or a probability where uk=0) and a Log-Likelihood Ratio L(p*) shown by a posterior probability (a probability where pk=1 or a probability where pk=0) concerning a data bit, based on anterior information L(uk) being likelihood information concerning data bit and anterior information L(pk) being likelihood information concerning a parity bit.

A sequence of the Log-Likelihood Ratio L(u*) and a sequence of the Log-Likelihood Ratio L(p*) are consecutively output from the code APP 474, and are supplied to the MUX puncture 475. The MUX puncture 475 multiplexes the sequence of the Log-Likelihood ratio L(u*) with the sequence of the Log-Likelihood ratio L(p*) and punctures a bit in accordance with the predetermined rule (puncture function). As a result, the likelihood information L(c*) is output from the MUX puncture 475.

In the code APP 474, a channel value Lc*yi may not be considered. Thus, the likelihood information L(c*) obtained by multiplexing the Log-Likelihood information L(u*) and L(p*) is expressed as follows:

$$L(c^*) = Le(c) + La(c) \quad (5)$$

Le(c): anterior information
La(c): external likelihood information.

And, the subtractor 478 subtracts the anterior information Le(c) (before the anterior information Le(c) is divided into L(uk) and L(pk)) supplied to the DEMUX depuncture 473 from the likelihood information L(c*). As a result, the external likelihood information La(ci) is obtained.

The external likelihood information La(ci) is supplied as the anterior information La(ci) to the PR channel APP 471 and the subtractor 478 via the interleaver ($\pi$) 476.

As described above, the iterative decoder 47 including the PR channel APP 471 and the code APP 474 repetitively conduct a decoding process by using the anterior information supplied from another side (iterative decoding).

And, the hard decision decoder 477 decides whether data bit Uk is "1" or "0", based on the Log-Likelihood ratio L(u*) related to data bit uk output from the code APP 474 when the decoding process is conducted a predetermined number of times. In detail, similarly to a case of the iterative decoding in a communication system described in Description of the Related Art, the hard decision decoder 477 decides that the data bit Uk is "1" (data bit Uk=1) when the Log-Likelihood ratio L(u*) is positive (L(u*)>0). On the other hand, the hard decision decoder 477 decides that the data bit Uk is "0" (data bit Uk=0) when the Log-Likelihood ratio L(u*) is negative (L(u*)<0). This decision result is output as decoded data.

In the data recording/reproducing apparatus 1000 configured as described above, since the magneto-optical disk 110 is a removable recoding medium, a condition of the decoding process in a case in which data is reproduced from a certain magneto-optical disk 110 is not always a suitable condition when data is reproduced from another magneto-optical disk 110. In addition, in a case in which data is reproduced from the same magneto-optical disk 110, an optimum condition is different for the decoding process in each of several data recording/reproducing apparatuses because of a performance difference between the several data recording/reproducing apparatuses.

Thus, before reproducing data from the magneto-optical disk 110, a test read process is conducted for data, and then an optimum channel value constant Lc (refer to the equation (2)) is determined to be used in the PR channel APP 471 of the iterative decoder 47. In order to realize such a process, in the read system, for example, an error rate calculator 49, an Lc controller 50, and a memory 51 as shown in FIG. 6 are provided as well as the iterative decoder 47 and the controller 48.

Figure 6:
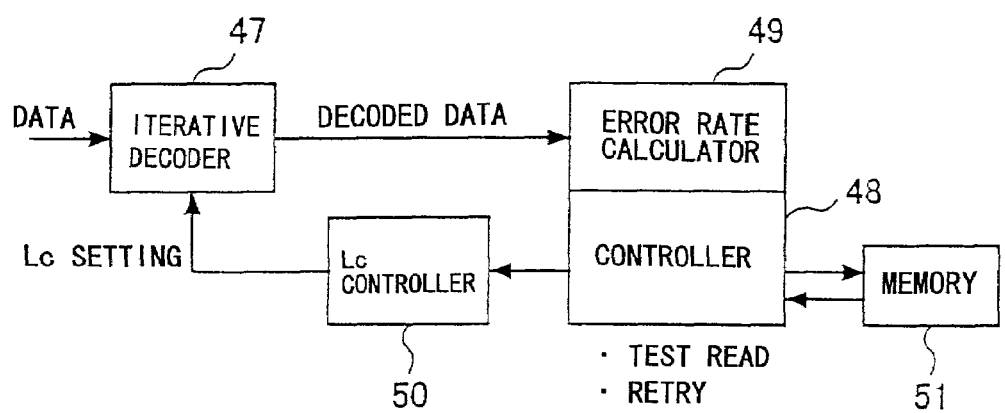
FIG. 6 is a block diagram showing a first configuration of a read system in the data recording/reproducing apparatus shown in FIG. 4.

In FIG. 6, the error rate calculator 49 calculates an error rate of the decoded data output from the iterative decoder 47. The controller 48 supplies a setting control signal of the channel value constant Lc to the Lc controller 50. The Lc controller 50 sets the channel value constant Lc based on the setting control signal supplied from the controller 48. The channel value constant Lc set by the Lc controller 50 is supplied to the PR channel APP 471 of the iterative decoder 47 (refer to FIG. 5).

Figure 7:
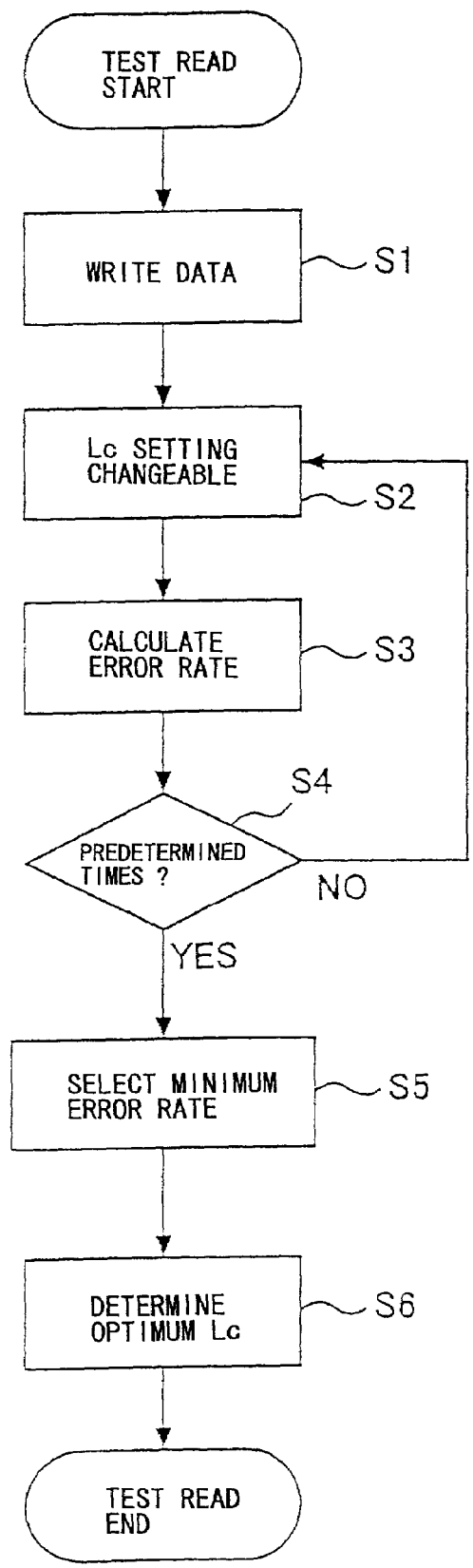
FIG. 7 is a flowchart showing one example of a process conducted by a controller in the read system shown in FIG. 6.

For example, the controller 48 generates a setting control signal for setting an optimum channel value constant Lc in accordance with steps shown in FIG. 7 while in an operation of the test read process. The controller 48 also controls the write system.

In FIG. 7, the controller 48 controls the write system to actuate and write data to the magneto-optical disk 110 (step S1). After the data is written on the magneto-optical disk 110, the controller 48 supplies the setting control signal for setting a channel value constant Lc to the Lc controller 50 (step S2).

When the Lc controller 50 sets the channel value constant Lc based on the setting control signal, the read system is controlled to read data written on the magneto-optical disk 110. And, the iterative decoder 47 inputs a sampling value of the reproduction signal obtained by reading data from the magneto-optical disk 110 and conducts the decoding process in accordance with a procedure described above. In the decoding process, the PR channel APP 471 uses the channel value constant Lc set by the Lc controller 50 (refer to the equation (2)).

When the error rate calculator 49 calculates an error rate with respect to the decoded data obtained by the decoding process, the controller 48 records a corresponding relationship between the channel value constant Lc and the error rate in a table in the memory 51 (step S3). The controller 48 determines whether or not the steps S2 and S3 are repeated the predetermined number of times (step S4). If it is determined that the steps S2 and S3 have not been repeated the predetermined number of times, the controller 48 outputs the setting control signal to consecutively change the channel value constant Lc, and the steps S2 and S3 are repeated. The controller 48 successively records the corresponding relationship between the channel value constant Lc being consecutively set while repeating the steps S2 and S3 and the error rate of the decoded data obtained by the decoding process using the channel value constant, in the memory 51.

When the steps S2 and S3 are repeated the predetermined number of times, the controller 48 specifies a minimum error rate in the error rates recorded in the table in the memory 51 (step S5). Then, the controller 48 determines the channel value constant Lc corresponding to the minimum error rate as the optimum channel value constant Lc (step S6).

When the optimum channel value constant Lc is determined, the test read process is terminated. After that, when data is reproduced, the controller 48 supplies the setting control signal to the LC controller 50 so as to set the optimum channel value constant Lc. Consequently, in the data reproducing process, the PR channel APP 471 of the iterative decoder 47 conducts the decoding process by using the optimum channel value constant Lc where the error rate is minimized during the test read process. Therefore, the decoded data having few errors is output from the iterative decoder 47.

The test read process is conducted every time the magneto-optical disk 110 is inserted into the data recording/reproducing apparatus 1000, or every fixed time interval.

In the data recording/reproducing apparatus 1000, in a case in which an error occurs when data already recorded on the magneto-optical disk 110 is reproduced, a retry operation is conducted to re-read data from the magneto-optical disk 110. Also, in the retry operation, it is possible to set a suitable channel value constant Lc by a first configuration shown in FIG. 6. FIG. 6 is a block diagram showing the first configuration of the read system in the data recording/reproducing apparatus 1000.

The controller 48 controls the write system to conduct the retry operation when data is reproduced and the error rate calculated by the error rate calculator 49 becomes more than a predetermined value. And in the retry operation, the controller 48 supplies the setting control signal to the Lc controller 50 so as to change the channel value constant Lc. The iterative decoder 47 (PR channel APP 471) conducts the decoding process by using the channel value constant Lc set by the Lc controller 50 based on the setting control signal.

And when the error rate, which is calculated by the error rate calculator 49 in respect to the decoded data obtained in the decoding process, becomes smaller than the predetermined value, the iterative decoder 47 (PR channel APP 471 ) conducts the decoding process by using the channel value constant Lc determined by the controller 48. On the other hand, when the error rate of the decoded data obtained by the retry operation does not become smaller than the predetermined value, the channel value constant Lc is further changed and the retry operation is conducted again. Accordingly, the retry operation is repeated until the error rate of the decoded data becomes smaller than the predetermined value while changing the channel value constant Lc within a predetermined number of times.

Figure 8:
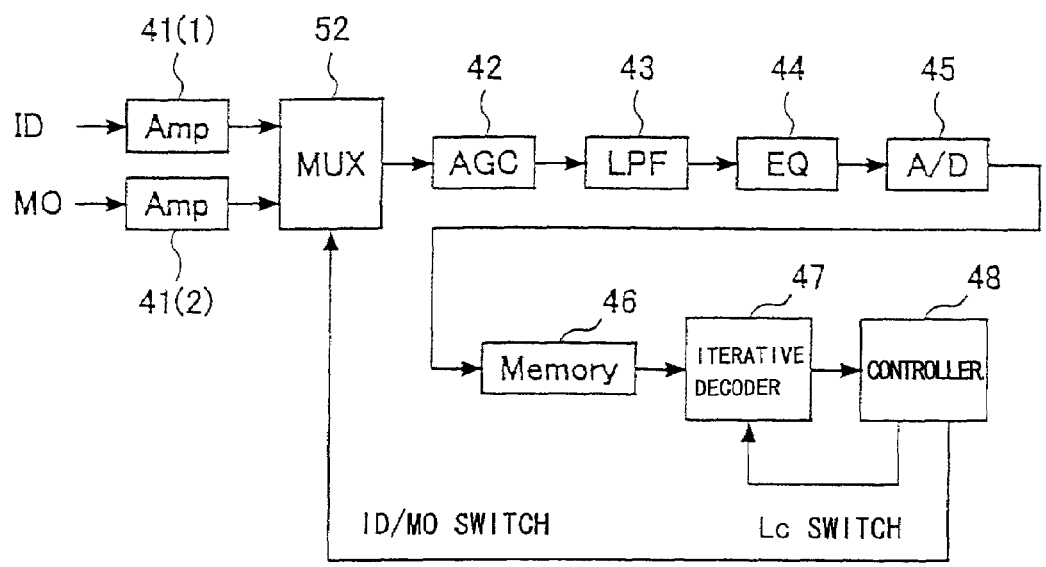
FIG. 8 is a block diagram showing a second configuration of the read system in the data recording/reproducing apparatus shown in FIG. 6.

In the magneto-optical disk 110, there are an ID region where information is recorded by pre-pits and a data region. The information in the ID region is detected by a difference of a light intensity. The information in the data region is detected by a polarity difference of a Kerr rotation angle. Because of a difference between a detecting method for detecting information in the ID region and a detecting method for detecting information in the data region, qualities of signals detected from the ID region and the data region are different. That is, S/Ns (signal to noise ratios) are different. Thus, the channel value constant Lc can be switched when reproducing the information in the ID region or when reproducing the information in the data region. In this case, for example, the read system of the data recording/reproducing apparatus 1000 can be configured as shown in FIG. 8. FIG. 8 is a block diagram showing a second configuration of the read system in the data recording/reproducing apparatus 1000.

In FIG. 8, a reproduction signal (hereinafter called an ID signal) obtained from the ID region and a reproduction signal (hereinafter called an MO signal) are supplied to a multiplexer 52 via Amps (Amplifiers) 41 (1) and 41 (2), respectively. The multiplexer 52 selects either one of the ID signal and the MO signal in response to an ID/MO switching control signal from the controller 48, and supplies to the AGC 42.

The waveform of the reproduction signal (the ID signal or the MO signal) processed in AGC 42 is adjusted by the LPF 43 and the equalizer 44. The reproduction signal which waveform is adjusted is sampled by the A/D converter 45. A sampling value is stored in the memory unit 46. The iterative decoder 47 (refer to FIG. 5) conducts the iterative decoding process for the sampling value stored in the memory unit 46 and generates the decoded data.

The controller 48 outputs a switching control signal of the channel value constant Lc to the iterative decoder 47 by synchronizing with the ID/MO switching control signal. When the read system reads the ID region of the magneto-optical disk 110, the controller 48 outputs the ID/MO switching control signal for selecting the ID signal to the multiplexer 52, and also outputs an Lc switching control signal for setting the channel value constant Lc suitable for the detecting method for detecting data on the ID region, to the iterative decoder 47. On the other hand, when the read system reads the data region of the magneto-optical disk 110, the controller 48 outputs the ID/MO switching control signal for selecting the MO signal to the multiplexer 52, and also outputs the Lc switching control signal for setting the channel value constant Lc suitable for the detecting method for detecting data in the data region, to the iterative decoder 47.

As a result, when the iterative decoder 47 (PR channel APP 471) decodes based on the sampling value of the ID signal, the channel value constant Lc suitable for the detecting method of the ID region is used. And when the iterative decoder 47 (PR channel APP 471) decodes based on the sampling value of the MO signal, the channel value constant Lc suitable for the detecting method of the MO region is used.

Accordingly, when data is reproduced from the ID region of the magneto-optical disk 110, and also when data is reproduced from the data region of the magneto-optical disk 110 it is possible to obtain the decoded data having fewer errors.

For example, the channel value constant Lc used when data in the ID region is reproduced and the channel value constant Lc used when data in the data region is reproduced are set experimentally beforehand. Two channel value constants Lc are maintained in the PR channel APP 471 of the iterative decoder 47 beforehand so as to be capable of being used when switched.

Each of two channel value constants Lc stored in the PR channel APP 471 can be updated to be suitable for the test read process or the retry process.

In the data recording/reproducing apparatus 1000, a recording process may not be precisely conducted because of environmental temperature, unstable power, a medium defect, or the like. In order to overcome such problems, generally, a recording state is checked by reading data recorded on the magneto-optical disk 110. This check is called a verify operation.

In the verify operation, since a data detection ability is high, in a case in which an apparatus reproduces data from a recording medium to which the apparatus itself recorded the data, even if it is determined that the recording medium stores normal reproducible data, it is not always determined that the recording medium is in a reproducible recording state when another apparatus reproduces the data recorded on the recording medium. Or the repetition number of times may increase for the decoding process necessary to reproduce normal data by another apparatus.

Therefore, in the verify operation, the iterative decoding is conducted in a decoding condition in which the repetition number of times of the decoding process is set to be fewer than the repetition number of times for a regular data reproducing process. Compared with the decoding condition for reproducing normal data, it becomes more difficult to reproduce the normal data in the decoding condition of the verify operation. If it is determined that the recording medium is in a recording state in which the normal data is reproducible, by the verify operation in the decoding condition in which the normal data is not easily reproduced, a margin of the decoding condition becomes bigger so that data is normally reproduced by another apparatus.

Figure 9:
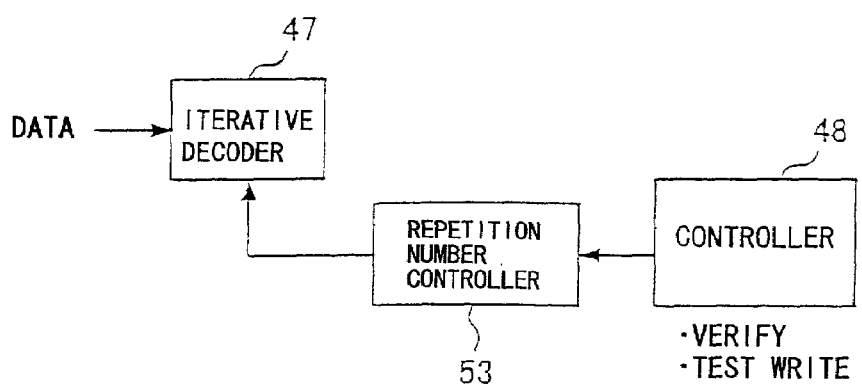
FIG. 9 is a block diagram showing a third configuration of the read system in the data recording/reproducing apparatus shown in FIG. 6.

FIG. 9 is a block diagram showing a third configuration of the read system in the data recording/reproducing apparatus 1000. In order to realize the verify operation, for example, as shown in FIG. 9, the read system of the data recording/reproducing apparatus 1000 includes a repetition number controller 53 as well as the iterative decoder 47 and the controller 48.

In the verify operation in the data recording/reproducing apparatus 1000, the controller 48 supplies a number setting control signal to the repetition number controller 53. The number setting control signal is supplied to set a repetition number of times which is fewer than the repetition number of times for the decoding process conducted for general data reproduction and may be one time. The repetition number controller 53 sets the repetition number of times for the decoding process at the iterative decoder 47 based on the number setting control signal. In the verify operation, the iterative decoder 47 conducts the decoding process for the repetition number of times set by the repetition number controller 53 and then outputs the decoded data obtained as a result.

Then, it is determined whether or not the data recording state in a magneto-optical disk 110 is suitable based on the error rate of the decoded data output from the iterative decoder 47.

In addition, in the data recording/reproducing apparatus 1000, a test write operation is conducted in order to realize to form an optimum record mark. The test write operation is conducted to compensate for an unstable optimum recording condition because of a different sensitivity of each magneto-optical disk 110. The test write operation is conducted every time the magneto-optical disk 110 is inserted into the data recording/reproducing apparatus 1000 or every fixed time interval.

Similar to the verify operation as described above, in a case in which test data written on the magneto-optical disk 110 is reproduced and the iterative decoder 47 conducts the decoding process in the same decoding condition as the general data is reproduced, when the data recording/reproducing apparatus 1000 reproduces data from the magneto-optical disk 110 on which the data was recorded by the data recording/reproducing apparatus 1000 itself, it is determined that the magneto-optical disk 110 is in the normal data reproducible recording state. However, in this case, even if the data is recorded to the magneto-optical disk 110 in a writing condition capable of obtaining the normal data reproducible recording state, it is not always possible to normally reproduce the data when another apparatus reproduces the data recorded on the magneto-optical disk 110. Or the repetition number of times may increase for the decoding process necessary to reproduce normal data by another apparatus.

Accordingly, in the test write operation, similar to the verify operation, the repetition number of times for the decoding process is decreased to be fewer than the repetition number of times for regularly reproducing data and then the iterative decoding process is conducted in the decoding condition in which it is not easy to reproduce the normal data. Data, which is written by the test write operation in the decoding condition difficult to reproduce the normal data, is examined. Then, the writing condition for the optimum data is determined. In the magneto-optical disk 110 where data is recorded in the writing condition determined as described above, the margin of the decoding condition becomes greater so as to normally reproduce data by another apparatus.

In the read system having the same configuration (FIG. 9) as that realizing the verify operation as described above, it is possible to realize a process in the test write operation.

That is, in the test write operation, in response to the number setting control signal from the controller 48, the repetition number controller 53 sets the repetition number (can be one time) fewer than the repetition number of the decoding process for the regular data reproducing process. In the test write operation, when the test data written on the magneto-optical disk 110 is reproduced, the iterative decoder 47 conducts the decoding process for the repetition number of times determined by the repetition number controller 53 and then outputs the decoded data obtained as a result.

Then, based on the error rate of the decoded data output from the iterative decoder 47, a write-in condition is examined for the magneto-optical disk 110.

Moreover, in the decoding process repetitively conducted by the repetition decoder 47, a data detecting ability is changed by a coding rate (a number of parity bits). When the coding rate is decreased (by increasing the number of parity bits) and redundancy is increased, the data detecting ability is improved. On the other hand, when the coding rate is increased (by decreasing the number of parity bits) and redundancy is decreased, the data detecting ability is decreased. However, when the redundancy is increased, record density is reduced. Thus, in practice, an optimum condition is determined by trade-off of the redundancy and the record density.

However, a characteristic of a recording medium (for example, the magneto-optical disk 110) is not constant, and there is a recording medium with a normal characteristic and a recording medium with a deteriorated characteristic. That is, the recording medium with a normal characteristic may be set to the data recording/reproducing apparatus 1000, or the recording medium with the deteriorated characteristic may be set to the data recording/reproducing apparatus 1000. In such a case, if the coding rate (redundancy) of the data is fixed by the trade-off with recording density, the data coded in the coding rate may not be carried out normally, depending on the recording medium used in a data recording reproducing apparatus 1000.

Then, it is required to change the coding rate when data is recorded.

Figure 10:
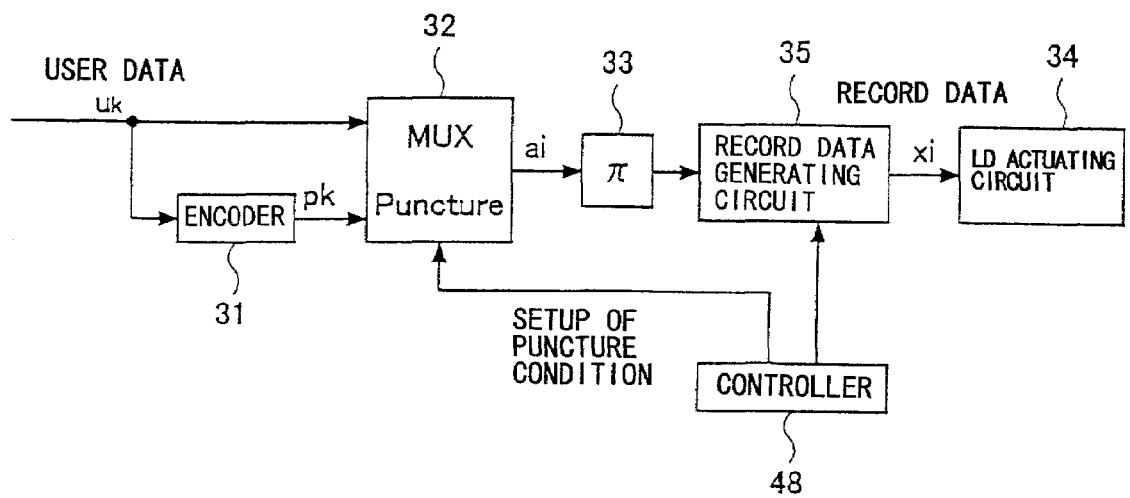
FIG. 10 is a block diagram showing a first configuration of a write system in the data recording/reproducing apparatus shown in FIG. 6.

In order to enable a change of such the coding rate, the write system in the data recording/reproducing apparatus 1000 is configured as shown in FIG. 10. FIG. 10 is a block diagram showing a first configuration of the write system in the data recording/reproducing apparatus 1000.

In FIG. 10, the write system includes a record data generating circuit 35 provided between the interleaver (π) 33 and the LD actuating circuit 34, as well as the encoder 31, the MUX puncture 32, the interleaver (π) 33, and the LD actuating circuit 34.

For example, based on a verification result of the write-in condition of the test write operation, the controller 48 supplies a setting control signal of the puncture condition for thinning out a bit, to the MUX puncture 32. In the test write operation, the controller 48 outputs the setting control signal for setting the puncture condition (default condition) defined beforehand, and then the test write operation is performed on the puncture condition. Consequently, when the normal data reproduction is not completed, the controller 48 outputs the setting control signal which lowers a puncture rate, which is a rate of thinning out a bit, (the coding rate is lowered). On the other hand, when the normal data reproduction is completed in the test write operation, the setting control signal for setting the puncture condition defined beforehand is maintained.

Figure 1:
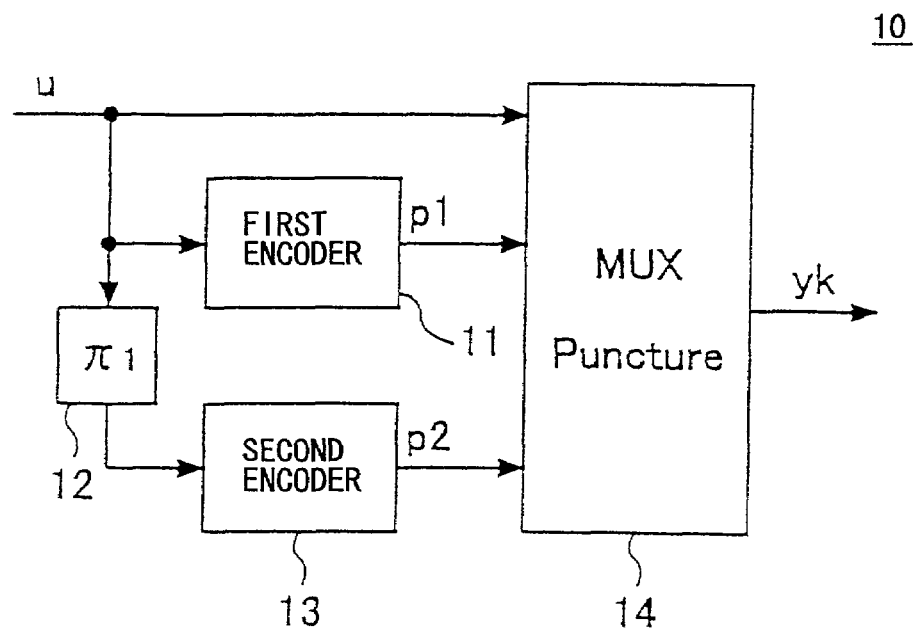
FIG. 1 is a block diagram showing a configuration example of a turbo coding device.

Thus, if the puncture condition is determined, the controller 48 supplies a detection pattern signal for specifying the puncture condition to the record data generating circuit 35. As mentioned above, the record data generating circuit 35 additionally provides the detection pattern to a head of the coding bit sequence ai which should be written in the MO region supplied through the interleaver (π) 33, and supplies it to the LD actuating circuit 34. Consequently, as shown in FIG. 1, the detection pattern is recorded on the recording medium (magneto-optical disc 110) in front of the data part (Data) in the MO region following a pre-pit region (ID region).

The example of setting the puncture condition will be described in detail.

Where a user data bit sequence uk is uk=(u0, u1, u2, u3, u4, u5, u6, u7, u8, u9, u10, u11, u12, u13, u14, u15, . . . , uN-2, uN-1), and the parity bit sequence pk output from the encoder 31 is pk=(p0, p1, p2, p3, p4, p5, p6, p7, p8, p9, p10, p11, p12, p13, p14, p15, . . . , pN-2, pN-1), the MUX puncture 32 generates the coding bit sequences ai as follows:

ai=(a0, a1, a2, a3, - - , aM-2, aM-1).

If the puncture condition defined beforehand responds to a coding rates 16/17, the MUX puncture 32 thins out the parity bit. Then, one parity bit is additionally provided for every 15 user data bits (refer to underlined part) so that the coding bit sequence ai becomes as follows:

$$ai = (a0, a1, a2, a3, \ldots, aM-2, aM-1)$$
$$= (u0, u1, u2, u3, u4, u5, u6, u7, u8, u9, u10,$$
$$u11, u12, u13, u14, u15, \underline{p15} \ldots, uN-2, uN-1).$$

In a case in which the test write is conducted on such puncture condition, when the normal data is not successfully reproduced, the controller 48 supplies the setting control signal for setting the puncture condition corresponding to the coding rate to the MUX puncture 32, so as to reduce the coding rate to eight ninths. Consequently, the MUX puncture 32 thins off the parity bit. Then, one parity bit is additionally provided for every 8 user data bits (refer to underlined part) so that the coding bit sequence ai becomes as follows:

$$ai = (a0, a1, a2, a3, \ldots, aM-2, aM-1)$$
$$= (u0, u1, u2, u3, u4, u5, u6, u7, \underline{p7}, u8, u9, u10,$$
$$u11, u12, u13, u14, u15, \underline{p15} \ldots, uN-2, uN-1).$$

Since puncture condition is controlled to lower the coding rate when the normal data is not obtained in the test write operation, the iterative decoding process is conducted with higher data detection ability of detecting the normal data. Therefore, it is possible to obtain the decoded data having fewer errors.

Figure 11:
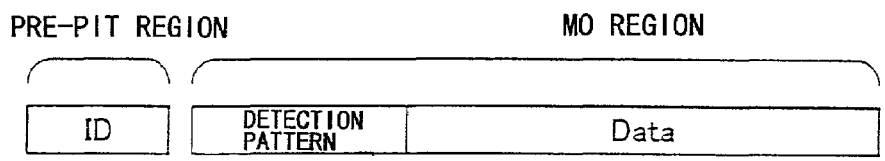
FIG. 11 is a block diagram showing an example of a data format recorded to a recording medium (magneto-optical disk)

Moreover, in a case in which the puncture condition is determined when data is written and the detection pattern for specifying the puncture condition is written on the recording medium as shown in FIG. 11, when the data is reproduced, the controller 48 can recognize the coding rate corresponding to the puncture condition based on the detection pattern, and can control the decode process by the iterative decoder 47 based on the coding rate.

In this example of setting the puncture condition, the puncture condition and the detection pattern for specifying puncture condition are written based on a result of the test write operation, but it is not limited to do so. Alternatively, for example, the puncture condition and the detection pattern may be written according to a mode setup operation such as a normal mode, a characteristic priority mode, or the like by a user. A medium type that is set can be detected and the puncture condition and the detection pattern may be written according to a detected medium type.

In the iterative decoding process, the data detection ability changes depending on a configuration of the encoder 31. By using a longer constraint length, the data detection ability is improved more when coded data obtained by the encoder 31 is decoded by the iterative decoding process. However, in the encoder 31 having longer constraint length, the encoding process becomes complex and it requires more time for the encoding process. In practice, characteristics of a process time and a recording medium are considered and then such an encoder is used that the data detection ability being more than a certain level can be expected in the iterative decoding process.

However, as mentioned above, the characteristic of the recording medium is not constant, and there are recording media with the normal characteristic and the recording media with the deteriorated characteristic. It is desired to change the configuration of the encoder 31 when data is recorded so as to obtain higher data detection ability in the iterative decoding process.

Figure 12:
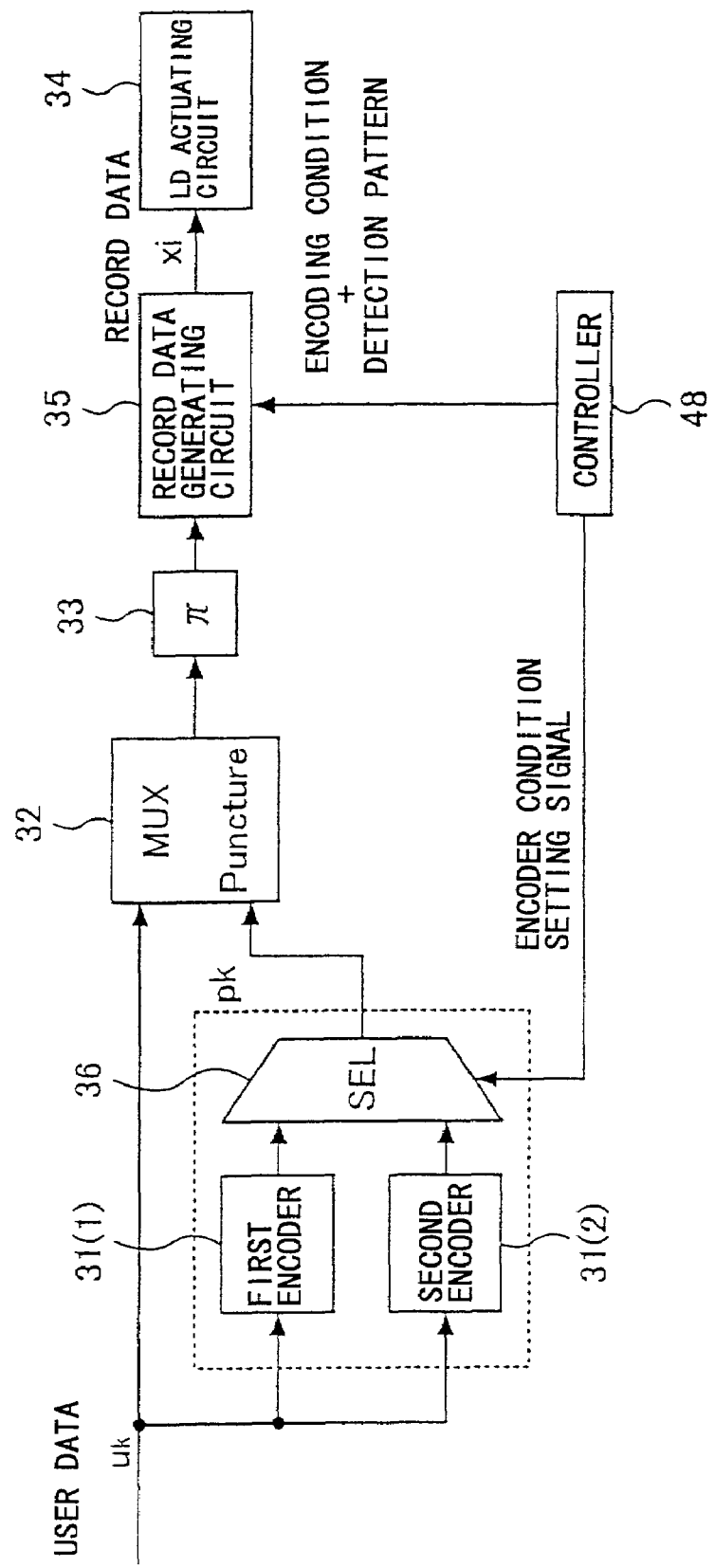
FIG. 12 is a block diagram showing a second configuration of the write system in the data recording/reproducing apparatus shown in FIG. 6.

In order to change the configuration of the encoder 31, for example, the write system of the data recording/reproducing apparatus 1000 can be constituted as shown in FIG. 12. FIG. 12 is a block diagram showing a second configuration of the write system in the data recording/reproducing apparatus 1000.

Figure 13:
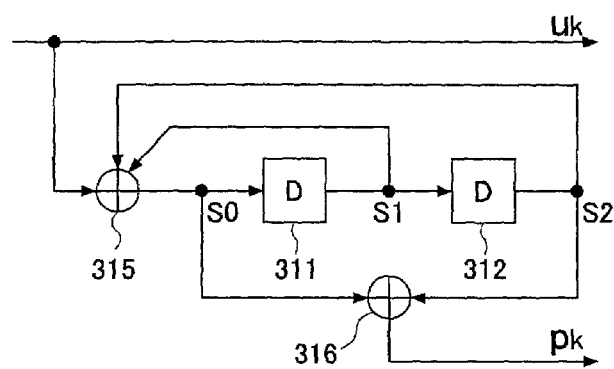
FIG. 13 is a block diagram showing a configuration example of a first encoder in the write system shown in FIG. 12.
Figure 14:
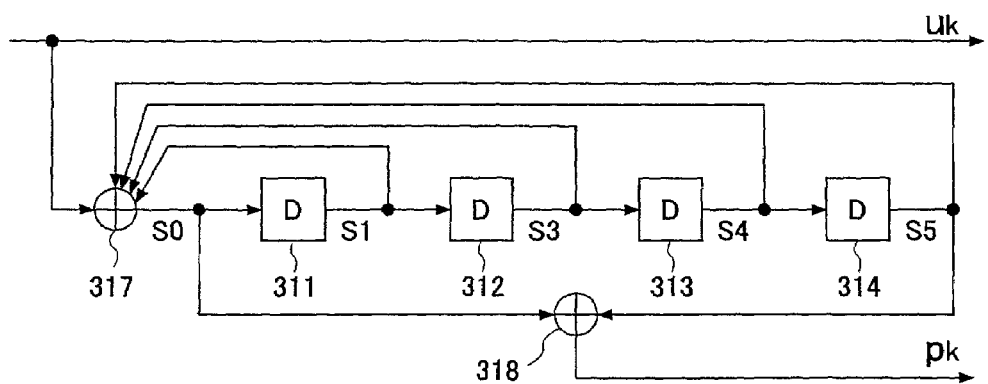
FIG. 14 is a block diagram showing a configuration example of a second encoder in the write system shown in FIG. 12.

In FIG. 12, the write system includes a first encoder 31 (1), a second encoder 31 (2), and a selecting circuit 36, as well as the MUX puncture 32, the interleaver (π) 33, the LD (laser) actuating circuit 34, and the record data generating circuit 35 which are the same circuits as in FIG. 10. FIG. 13 is a block diagram showing a configuration example of a first encoder in the write system shown in FIG. 12. For example, as shown in FIG. 13, the first encoder 31 (1) is a recursive convolutional encoder including two delay elements 311 and 312 and two difference gates 315 and 316, and conducts the encoding process by a constraint-length "3" (=3). FIG. 14 is a block diagram showing a configuration example of a second encoder in the write system shown in FIG. 12. As shown in FIG. 14, for example, the second encoder 31 (2) includes a recursive convolutional encoder including four delay elements 311, 312, 313, and 314 and two difference gates 317 and 318, and conducts the encoding process by a constraint-length "5" (=5).

For example, based on the verification of the writing condition in the test write operation mentioned above, the controller 48 outputs an encoder condition setting signal for indicating either one the first encoder 31 (1) and the second encoder 31 (2), to a selecting circuit 36. For example, in the test write operation, the controller 48 supplies the encoder condition setting signal for selecting the first encoder 31 (1), to the selecting circuit 36. In a state in which the selecting circuit 36 selects the parity bit sequence from the first encoder 31 (1) with the encoder condition setting signal, the test write operation is conducted. Consequently, when the normal data reproduction is not completed, the controller 48 supplies the encoder condition setting signal for selecting the second encoder 31 (2) of a longer constraint length to the selecting circuit 36.

On the other hand, when the normal data reproduction is completed in the test write operation, the encoder condition setting signal for selecting the first encoder 31 (1) is maintained.

Thus, if either one of the first encoder 31 (1) and the second encoder 31 (2) is selected, the controller 48 supplies the detection pattern signal for specifying a selected encoder to the record data generating circuit 35. Similar to the example (refer to FIG. 11) mentioned above, the record data generating circuit 35 additionally provides the detection pattern to the head of the coding bit sequence ai which is to be written in the MO region, and supplies it to the LD actuating circuit 34. Consequently, as shown in FIG. 11, the detection pattern is recorded in front of the data part (Data) in the MO region following the pre-pit region (ID region) on the recording medium (magneto-optical disc 110).

When the normal data is not obtained in the test write operation, one encoder having the longer constraint length is selected and the encoding process is conducted. Accordingly, the iterative decoding process having a higher data detection ability is conducted. Therefore, it is possible to obtain the decoded data having fewer errors.

Moreover, as shown in FIG. 11, since the detection pattern, which specifies the encoder used when data is recorded, is written to the recording medium, the controller 48 can recognize the characteristic of the encoder used based on the detection pattern when the data is reproduced. Accordingly, it is possible to control the decoding process at the iterative decoder 47 based on the characteristic of the encoder.

In the example described above, the detection pattern, which selects the encoder and specifies the selected encoder, is written based on a result of the test write operation, but it is not limited to do so. For example, the detection pattern may be written depending on a mode setup such as a normal mode or a characteristic priority mode determined by a user. Alternatively the medium type can be detected and then the detection pattern may be written in accordance with the detected medium type.

In the data recording/reproducing apparatus 1000, if the repetition number of times in the iterative decoding process becomes larger, the data detection ability is improved. However, if the number of times of repetition becomes larger, the transfer rate of data becomes slower. It is important to set the repetition number of times to be a suitable number.

Figure 15:
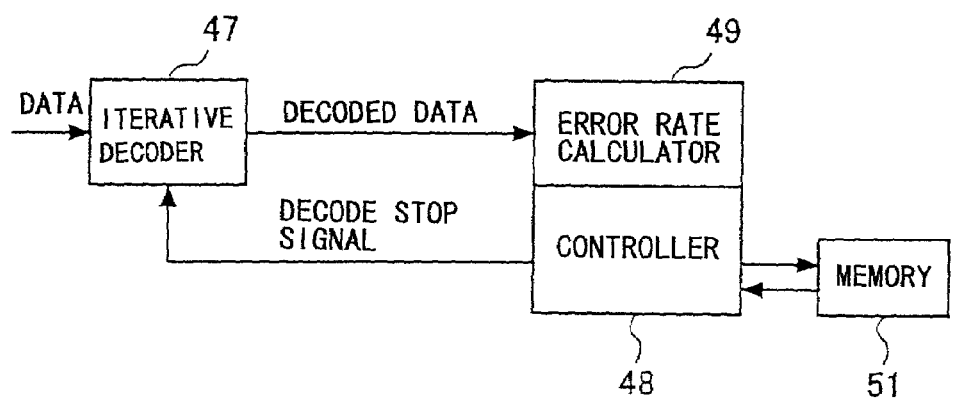
FIG. 15 is a block diagram showing a fourth configuration of the read system in the data recording/reproducing apparatus shown in FIG. 6.

Then, in order to properly control the repetition number of times for the decoding process, for example, as shown in FIG. 15, the read system of the data recording/reproducing apparatus 1000 includes the error rate calculator 49 as well as the iterative decoder 47 and a controller 48. FIG. 15 is a block diagram showing a fourth configuration of the read system in the data recording/reproducing apparatus 1000.

Figure 16:
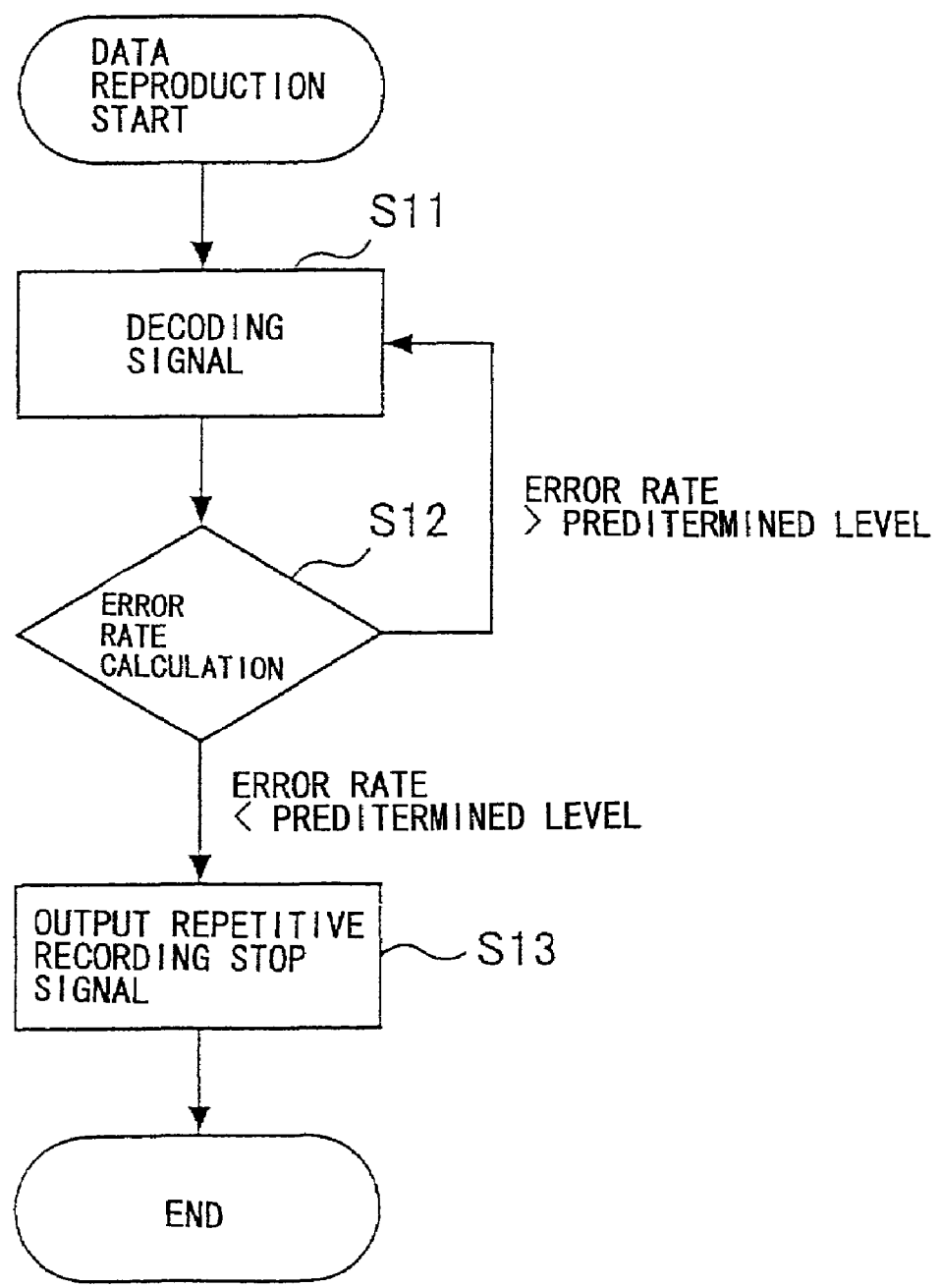
FIG. 16 is a flowchart showing one example of a process conducted by the controller in the read system shown in FIG. 15.

In the data recording/reproducing apparatus 1000 having this configuration, the controller 48 conducts a process in accordance with steps shown in FIG. 16 when data is reproduced. FIG. 16 is a flowchart showing one example of a process conducted by the controller in the read system shown in FIG. 15.

In FIG. 16, the controller 48 obtains the decode data from the iterative decoder 47, if the iterative decoding process in the iterative decoder 47 is started when data is reproduced (step S11). The controller 48 determines whether or not the error rate calculated by the error rate calculator 49 based on the decode data is larger or smaller than a predetermined level (step S12). The predetermined level is defined based on whether or not the error rate of the decoded data at the predetermined level can be made reliable by an error correcting code (ECC). That is, if the error rate is smaller than a predetermined level, the decoded data can be made reliable by the error correcting code. On the other hand, if the error rate is greater than the predetermined level, the decoded data cannot be made reliable by the error correcting code.

When the error rate calculated by the error rate calculator 49 is larger than the predetermined level, the controller 48 does not send a stop signal, in order to repetitively continue the decoding process at the iterative decoder 47. Accordingly, when the error rate of the decoded data is greater than the predetermined level, the iterative decoder 47 repetitively conducts the decoding process (steps S11 and S12 are repeated).

Thus, when the error rate of the decoded data, which is obtained while the decoding process is repetitively conducted, becomes smaller, the controller 48 supplies an iterative decode stop signal to the iterative decoder 47 (step S13). Upon receiving the iterative decode stop signal, the iterative decoder 47 stops the decoding process being repetitively performed.

Accordingly, the iterative decoder 47 repeats the decoding process until the error rate of the decoded data can be corrected by the error correcting code (ECC). That is, the decoded data obtained when the decoding process is completed can be corrected into a proper data by using the error correcting code (ECC) at least, even if the error rate is not zero. The decoding process is not repeated until the error rate becomes zero. However, it is possible to realize the decoding process to be more efficient.

Furthermore, as mentioned above, the data detection ability in the iterative decode is influenced by the configuration of the encoder 31 (refer to the example shown in FIG. 12). For example, if the number of encoders is increased, the data detection ability in the iterative decoding process is further improved. However, the encoding process becomes complex. Then, it is desired to control the number of encoders to obtain an optimal coding rate based on the characteristic of the recording medium (magneto-optical disk 110)

Figure 17:
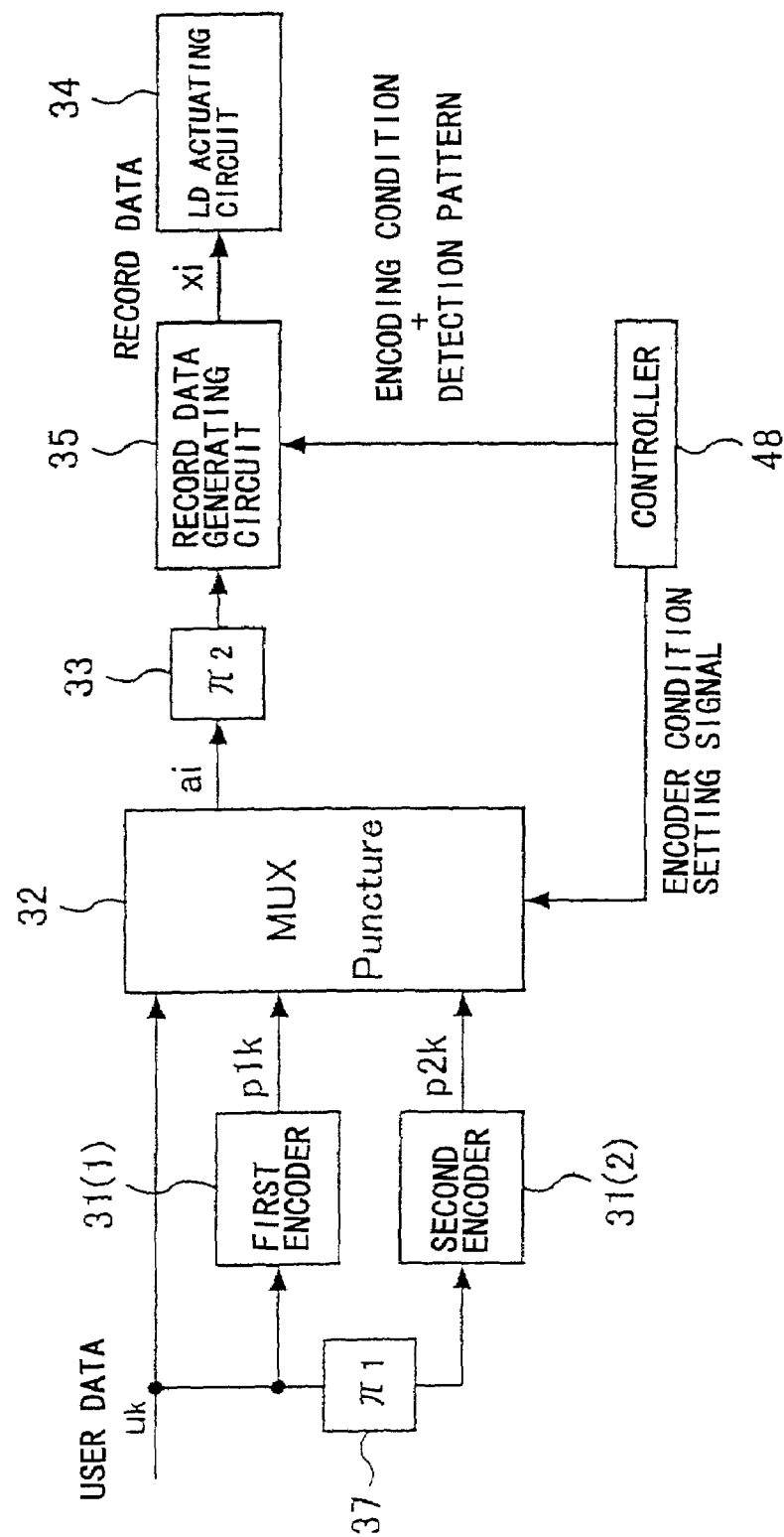
FIG. 17 is a block diagram showing a third configuration of the write system in the data recording/reproducing apparatus shown in FIG. 6.

For example, in order to control the number of the encoders when data is recorded, the write system of the data recording/reproducing apparatus 1000 may be configured as shown in FIG. 17. FIG. 17 is a block diagram showing a third configuration of the write system in the data recording/reproducing apparatus 1000.

In FIG. 17, the write system includes the first encoder 31 (1), the second encoder 31 (2), and the interleaver (π1) 37, as well as the MUX puncture 32, the interleaver (π) 33, the LD actuating circuit 34, and the record data generating circuit 35. The first encoder 31 (1) inputs the user data sequence uk, and generates a first parity bit sequence p1k by a recursive convolutional encoding process. The second encoder 31 (2) inputs the bit sequence obtained when the user data sequence uk is processed by the interleaver (π) 37, and generates a second parity bit sequence p2k by the recursive convolutional encoding process. The MUX puncture 32 multiplexes the user data sequence uk, the first parity bit sequence p1k, and second parity bit sequence p2k in accordance with a predetermined rule. Also the MUX puncture 32 punctures a bit in accordance with the puncture condition based on an encoder condition setting signal supplied from the controller 45 (as described later).

Similar to the examples shown in FIG. 10 and FIG. 12, the controller 48 supplies the encoder condition setting signal to the MUX puncture 32 based on the test write operation, the mode setup operation, the medium type, and the like. The encoder condition setting signal shows the puncture condition for conducting the puncture function in accordance with a predetermined rule by multiplexing the parity bit sequence p1k from the first encoder 31 (1) with the user data sequence uk in general. On the other hand, when the encoder condition setting signal is output in a case in which the data detection ability is raised, the encoder condition setting signal shows the puncture condition for conducting the puncture function in accordance with a predetermined rule by multiplexing the first parity bit sequence p1k and the second parity bit sequence p2k output from the first encoder 31 (1) and the second encoder 31 (2), respectively.

In general, the first parity bit sequence p1k from the first encoder 31 (1) is additionally provided to the user bit sequence uk, and the coding bit sequence ai is generated. In a case in which the characteristic is prioritized, the first parity bit sequence p1k and the second parity bit sequence p2k output from the first encoder 31 (1) and the second encoder 31 (2) are additionally provided to the user bit sequence uk, and the coding bit sequence ai is generated. And similar to the examples shown in FIG. 10 and FIG. 12, the controller 48 supplies a detection pattern signal showing an encoding condition (number of encodes) specified by the encoder condition setting signal. The record data generating circuit 35 additionally provides the detection pattern to the head of the coding bit sequence ai which is to be written in the MO region, and supplies to the LD actuating circuit 34. Consequently, as shown in FIG. 11, the detection pattern is recorded before the data part (Data) in the MO region following the pre-pit region (ID region).

Therefore, it is possible to recognize which encoder conducts the encoding process based on the detection pattern, when data is reproduced.

An example of setting the encoding condition will now be described.

It is assumed that the user data bit sequence uk becomes as follows:

uk (u0, u1, u2, u3, u4, u5, u6, u7, u8, u9, u10, u11, u12, u13, u14, u15, . . . , uN-2, uN-1), the parity bit sequence pk output from the encoder 31 becomes as follows;

pk=(p0, p1, p2, p3, p4, p5, p6, p7, p8, p9, p10, p11, p12, p13, p14, p15, . . . , pN-2, pN-1).

Then, the MUX puncture 32 generates the following encoding bit sequence ai:

ai=(a0, a1, a2, a3, . . . , aM-2, aM-1)

If the encoding condition defined beforehand corresponds to the coding rates 8/9 using the parity bit sequence p1k from the first encoder 31 (1), the MUX puncture 32 punctures the parity bit. Then, one parity bit is additionally provided for every 8user data bits (refer to underlined part) so that the coding bit sequence ai becomes as follows:

$$ai = (a0, a1, a2, a3, \ldots, aM-2, aM-1)$$
$$= (u0, u1, u2, u3, u4, u5, u6, u7, \underline{p1, 7}, u8, u9, u10,$$
$$u11, u12, u13, u14, u15, \underline{p1, 15} \ldots,$$
$$uN-2, uN-1, \underline{p1, N-1}).$$

Moreover, in order to prioritize the performance, if the encoding condition corresponds to the coding rates 8/9 using parity bit sequence p1k and p2k from the first encoder 31 (1) and the second encoder 31 (2), the MUX puncture 32 thins off the parity bit. Then, one parity bit is additionally provided for every 8user data bits (refer to underlined part) so that the coding bit sequence ai becomes as follows:

$$ai = (a0, a1, a2, a3, \ldots, aM-2, aM-1)$$
$$= (u0, u1, u2, u3, u4, u5, u6, u7, \underline{p1, 7}, u8, u9, u10,$$
$$u11, u12, u13, u14, u15, \underline{p2, 15} \ldots,$$
$$uN-2, uN-1, \underline{p2, N-1}).$$

In addition, in the examples shown in FIG. 10, FIG. 12, and FIG. 17, although the detection pattern showing each of conditions (coding rate (puncture conditions), an encoder configuration (constraint length, the number of encoders) is recorded on the recording medium, it is not necessary to record such a record pattern. In this case, for example, the decoding condition in the iterative decoder 47 in the read system is consecutively changed based on the error rate of the decoded data, so as to output the decoded data as a final decoded data where the error rate becomes minimum.

In each example described above, the data recording/reproducing apparatus 1000 (optical disk apparatus) is illustrated. The examples in which the process in the write system is not required, can be applied to a data reproducing only apparatus for data reproduction.

According to the embodiment described above, the functions of the controller 48 and the Lc controller 50 shown in FIG. 6, and the function of the controller 48 shown in FIG. 8 correspond to a constant value controlling part. The error rate calculator 49 corresponds to an error state detecting part.

Moreover, processes in the function of the controller 48 shown in FIG. 15 and the step S12 shown in FIG. 16 correspond to a determining part. The process in the step S13 shown in FIG. 16 corresponds to a decoding controlling part.

Furthermore, the function of the controller 48 and the repetitive number controller 53 corresponds to a repetitive number controlling part. The functions of the controller 48, the MUX puncture 32, the first and the second encoders 31 (1) and 31 (2) and the selecting circuit 36 shown in FIG. 10, and the first and the second encoders 31 (1) and 31 (2) shown FIG. 17, the functions of the MUX puncture 32 and the controller 48 correspond to an encoding condition controlling part. And the record data generating circuit 35 shown in FIG. 10, FIG. 12, and FIG. 17 corresponds to an encoding condition write controlling part.

According to the present invention, it is possible to determine the value of the channel value constant used during the iterative decoding process so as to obtain the decoded data having fewer errors from the recording medium.

In any case in which the iterative decoding process is conducted, it is possible for the constant value controlling part to control the value of the channel value constant. For example, the value of the channel value constant can be controlled in a case of conducing the test read operation for data recorded on the recording medium, or in a case of conducting the retry operation when the decoded data having fewer errors is not obtained.

According to the present invention, a detecting part is provided to detect the error state (for example, error rate) of the decoded data obtained in the iterative decoding process. The constant value controlling part can control the value of the channel value constant based on the detection result by the detecting part.

The accuracy of the decoded data obtained in the iterative decoding process is different depending on a method for writing the encoded data. According to the present invention, the stable decoded data can be obtained even if there are regions where data are written in accordance with different writing methods on a single recording medium.

According to the present invention, it is possible to provide the data reproducing apparatus in which the iterative decoding process is conducted until the error of the decoded data becomes small enough so that the error can be corrected in accordance with a predetermined code correction approach. Therefore, even if data is reproduced from any recording medium, the decoded data can always be obtained in a state better than an error correctable state in accordance with the predetermined code correcting approach.

In addition, it is not required to repeat the decoding process until the errors of the decoded data are completely corrected. Therefore, it is not necessary to excessively reduce the transfer rate of data.

The code correction approach is not specifically limited. For example, the error correcting code (ECC) can be used.

In the data recording/reproducing apparatus according to the present invention, when the record state of encoded data is verified based on the state of the error of the decoded data, the iterative decoding process is conducted on the conditions in which the repetition number of times of the decoding process is reduced to fewer than the repetition number of times when the regular data reproduction is conducted, and it becomes the decode conditions in which normal data cannot be reproduced easier than the regular data reproduction. When the verification is conducted on the decode conditions in which such normal data cannot reproduce easily and it is determined that the recording medium is in a record state in which data can be normally reproduced, margin for the decoding conditions to normally reproduce data becomes greater at another apparatus. Moreover, the decoded data having fewer errors can be generated from several types of the recording medium that are verified.

The verification of the record state of the decoded data based on the error state of the decoded data can be conducted in the test write operation for writing test data on the recording medium, or in the verify operation for verifying the recording medium.

In the data recording/reproducing apparatus according to the present invention, the coding condition affecting the data detection ability in the iterative decoding process can be controlled. Then, data encoded in accordance with the turbo coding method based on the coding condition can be recorded on the recording medium.

Accordingly, when the encoded data is recorded on the recording medium that requires a prioritization of the characteristic, data is encoded by the turbo coding method in the coding condition in which the data detection ability in the iterative decoding process becomes higher, and then the encoded data is recorded on the recording medium.

The coding conditions is not limited, if the data detection ability in the iterative decoding process is affected. For example, the coding rate, the encoder configuration (constraint length), the number of encoders, and the like can be controlled as the coding condition.

The present invention is not limited to the specifically disclosed embodiments, variations and modifications, and other variations and modifications may be made without departing from the scope of the present invention.

The present application is based on Japanese Priority Application No. 2001-191676 filed on Jun. 25, 2001, the entire contents of which are hereby incorporated by reference.

What is claimed is:

1. An apparatus for reproducing data, comprising:
   a decoded data generating part generating decoded data based on a reproduction signal from a recording medium in accordance with an iterative decoding method corresponding to a turbo coding method; and
   a constant value controlling part controlling a value of a channel value constant used in an iterative decoding process when said decoded data is generated in accordance with the iterative decoding method, the channel value constant being determined based on a signal to noise ratio showing a quality of the reproduction signal.

2. The apparatus as claimed in claim 1, wherein when said reproduction signal from each of regions where data is written by a different writing method of said recoding medium is decoded, said constant value controlling part controls said value of said channel value constant so as to be different for each of said regions.

3. The apparatus as claimed in claim 1, further comprising:
   an error state detecting part detecting an error state of said decoded data obtained by said iterative decoding process,
   wherein said constant value controlling part controls said value of said channel value constant based on a detection result of said error state of said decoded data by said error state detecting part.

4. An apparatus for reproducing data, comprising:
   a decoded data generating part generating decoded data based on a reproduction signal from a recording medium in accordance with an iterative decoding method corresponding to a turbo coding method, an error state detecting part detecting an error state of said decoded data obtained in a decoding process, a determining part determining whether or not said error state of said decoded data, which is detected by said error state detecting part, is correctable in accordance with a predetermined code correcting method, and a decode controlling part controlling said iterative decoding process to stop when said determining part determines that said error state of said decoded data is correctable in accordance with the predetermined code correcting method.

5. An apparatus for recording and reproducing data, comprising:

a write system writing data encoded in accordance with a turbo coding method, to a recording medium;

a read system generating decoded data based on a reproduction signal from said recording medium in accordance with an iterative decoding method corresponding to said turbo coding method; and a repetitive number controlling part controlling a number of times for said iterative decoding process to be fewer than a regular repetitive number when data is reproduced, when said read system conducts said iterative decoding process based on said reproduction signal from said recording medium where said write system records the encoded data, and generates said decoded data, and a recording state of said encoded data is verified based on an error state of said decoded data generated in said read system.

6. An apparatus for recording and reproducing data, comprising:

a write system writing data encoded in accordance with a turbo coding method, to a recording medium;

a read system generating decoded data based on a reproduction signal from said recording medium in accordance with an iterative decoding method corresponding to said turbo coding method, wherein a value of a channel value constant is used in an iterative decoding process when said decoded data is generated in accordance with the iterative decoding method, and the channel value constant is determined based on a signal to noise ratio showing a quality of the reproduction signal;

an encoding condition controlling part controlling an encoding condition influencing data detection ability in an iterative decoding process in said read system when said data encoded in accordance with said turbo coding method is generated.

7. The apparatus as claimed in claim 6, further comprising an encoding condition write controlling part writing information specifying said encoding condition controlled by said encoding condition controlling part as well as said data encoded in accordance with said turbo coding method.

8. A method for reproducing data, comprising the steps of:

generating decoded data based on a reproduction signal from a recording medium in accordance with an iterative decoding method corresponding to a turbo coding method; and controlling a value of a channel value constant used in an iterative decoding process when said decoded data is generated in accordance with the iterative decoding method, the channel value constant being determined based on a signal to noise ratio showing a quality of the reproduction signal.

9. A method for reproducing data, comprising the steps of:

(a) generating decoded data based on a reproduction signal from a recording medium in accordance with an iterative decoding method corresponding to a turbo coding method, (b) detecting an error state of said decoded data obtained in a decoding process, (c) determining whether or not said error state of said decoded data, which is detected in said step (b), is correctable in accordance with a predetermined code correcting method, and (d) controlling said iterative decoding process to stop when said step (b) determines that said error state of said decoded data is correctable in accordance with a predetermined code correcting method.

10. A method for recording and reproducing data, comprising the steps of:

(a) writing data encoded in accordance with a turbo coding method, to a recording medium;

(b) generating decoded data based on a reproduction signal from said recording medium in accordance with an iterative decoding method corresponding to said turbo coding method; and (c) controlling a number of times for an iterative decoding process to be fewer than a regular repetitive number when data is reproduced, when said read system conducts said iterative decoding process based on said reproduction signal from said recording medium where said write system record encoded data, and generates said decoded data, and a recording state of said encoded data is verified based on an error state of said decoded data generated in said read system.

11. A method for recording and reproducing data, comprising the steps of:

(a) writing data encoded in accordance with a turbo coding method, to a recording medium;

(b) generating decoded data based on a reproduction signal from said recording medium in accordance with an iterative decoding method corresponding to said turbo coding method; and (c) controlling an encoding condition influencing data detection ability in an iterative decoding process in said read system when said data encoded in accordance with said turbo coding method is generated, wherein a value of a channel value constant is used in an iterative decoding process when said decoded data is generated in accordance with the iterative decoding method, and the channel value constant is determined based on a signal to noise ratio showing a quality of the reproduction signal.

* * * * *